US006365470B1

(12) United States Patent
Maeda

(10) Patent No.: US 6,365,470 B1
(45) Date of Patent: Apr. 2, 2002

(54) METHOD FOR MANUFACTURING SELF-MATCHING TRANSISTOR

(75) Inventor: Tatsuro Maeda, Ibaraki (JP)

(73) Assignee: Secretary of Agency of Industrial Science and Technology, Tokyo (JP)

( * ) Notice: Subject to any disclaimer, the term of this patent is extended or adjusted under 35 U.S.C. 154(b) by 0 days.

(21) Appl. No.: 09/751,109

(22) Filed: Dec. 29, 2000

(30) Foreign Application Priority Data

Aug. 24, 2000 (JP) ....................................... 2000-253369
Dec. 14, 2000 (JP) ....................................... 2000-380782

(51) Int. Cl.[7] .............................................. H01L 21/336

(52) U.S. Cl. ....................................................... 438/299

(58) Field of Search ................................. 438/180, 197, 438/201, 299, 301, 307, 308, 542, 558, 585

(56) References Cited

U.S. PATENT DOCUMENTS

| | | | | |
|---|---|---|---|---|
| 5,466,615 A | * 11/1995 | Tsai | ............................ | 437/31 |
| 5,545,579 A | * 8/1996 | Liang et al. | .................. | 137/44 |
| 6,054,355 A | * 4/2000 | Inumiya et al. | ............. | 438/296 |
| 6,204,133 B1 | * 3/2001 | Yu et al | ..................... | 438/299 |

* cited by examiner

*Primary Examiner*—David Nelms
*Assistant Examiner*—Quoc Hoang
(74) *Attorney, Agent, or Firm*—Workman, Nydegger & Seeley

(57) ABSTRACT

A diffusion source included a diffusion source layer is diffused into both a source area and a drain area in a self-aligning manner by using heat treatment, and after the self-aligning thermal diffusion, a gate insulating film and a metal gate electrode are formed over both the gate area and the thermally diffused diffusion source layer. Then, a lift-off operation is performed to form a gate stacking structure having the gate insulating film and the gate electrode formed only according to the gate area.

16 Claims, 2 Drawing Sheets

METHOD FOR MANUFACTURING SELF-MATCHING TRANSISTOR

This application is based on Japanese Patent Application Nos. 2000-253369 filed Aug. 24, 2000 and 2000-380782 filed Dec. 14, 2000, the contents of which are incorporated hereinto by reference.

BACKGROUND OF THE INVENTION

1. Field of the Invention

The present invention relates to a process for manufacturing a self-aligned transistor for being applicable to fields of MIS (Metal Insulator Semiconductor) FETs (Field Effect Transistors) or the like.

2. Description of the Related Art

1. Conventional Example

A conventional process for manufacturing a self-aligned transistor will be described below.

First, a gate insulating film and a gate electrode are sequentially formed on a semiconductor substrate. Then, ion implantations of impurities are performed into the semiconductor substrate by using those layers as a mask. Subsequently, the impurities injected semiconductor substrate is activated by thermal annealing to form a gate area, a source area, and a drain area in a self-aligning manner, thereby producing a self-aligned transistor.

2. Problems of the Conventional Example

In producing the self-aligned transistor, materials of the gate insulating film and the gate electrode must not be destroyed or modified during a subsequent process of thermal treatment based on thermal annealing.

Thus, in the conventional manufacturing process, the gate insulating film is comprised of a silicon oxide film ($SiO_2$), and the gate electrodes is comprised of polycrystalline silicon.

However, in recent years, efforts have been made to increase the speed of transistors in order to improve transistor performance thereof, by increasing a current driving capability, reducing a parasitic resistance, and restraining variations in a threshold voltage, etc.

A possible means for improving these electrical characteristics is to use a thermally intolerant material for the gate insulating film and the gate electrode. Moreover, in this case, for manufacturing costs, a conventional semiconductor manufacturing process technique is advantageously used as changelessly as possible.

In the above described conventional manufacturing process, however, such a thermally intolerant material cannot actually be used because the thermal treatment process is carried out after the gate insulating film has been formed.

SUMMARY OF THE INVENTION

An object of the present invention is to provide a process for manufacturing a self-aligned transistor, even if a thermally intolerant material is used as a material of a gate insulating film and the gate electrode, thereby producing high performance, high reliable and inexpensive transistor devices.

There is provided a process for manufacturing a self-aligned transistor comprising steps of:

forming a diffusion source layer including a diffusion source for diffusion on areas corresponding to a gate area, a source area, and a drain area;

forming a pattern, corresponding to the gate area, on the diffusion source layer, and further removing the diffusion source layer correspondence to the pattern to form the gate area;

diffusing the diffusion source included the diffusion source layer into both the source area and the drain area except the gate area, by using heat treatment;

forming a gate insulating film over both the gate area and the thermally diffused diffusion source layer, and further forming a gate electrode, comprised of metal, over the gate insulating film;

removing the diffusion source layer as well as the gate insulating film and the gate electrode formed on the diffusion source layer to form a gate stacking structure having both the gate insulating film and the gate electrode formed only according to the gate area.

The above and other objects, effects, features, and advantages of the present invention will become more apparent from the following description of embodiments thereof taken in conjunction with the accompanying drawings.

DETAILED DESCRIPTION OF PREFERRED EMBODIMENTS

An embodiment of the present invention will be described below in detail with reference to the drawings.

A process for manufacturing a field effect transistor will be explained with reference to FIGS. 1A to 2C.

In this case, an example of MIS FET that is produced as a field effect transistor will be described.

(Step 1)

Figure 1A:
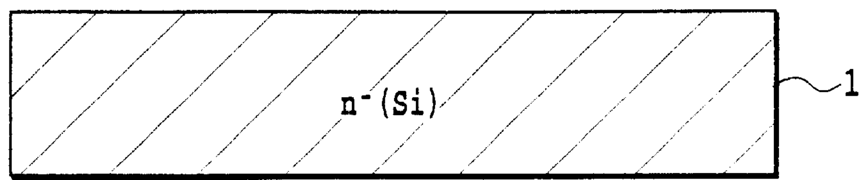
FIGS. 1A, 1B and 1C are process diagrams showing a manufacturing process of an MIS FET as an embodiment according to the present invention.

First, in FIG. 1A, a semiconductor substrate 1 is provided.

A p-type or n-type silicon substrate with low-impurity density is used as the semiconductor substrate 1. Here, an n-type low density (shown as $n^-$) silicon (Si) substrate is used.

The impurity density is between $10^{15}$ and $10^{18}/cm^3$. A thickness of the substrate is between 0.1 mm and 1 mm.

Other devices are concurrently incorporated into a surface layer area of the silicon substrate 1, but description thereof is omitted. The semiconductor substrate 1 is not limited to the silicon substrate but may be comprised of GaAs or the like.

(Step 2)

Figure 1B:
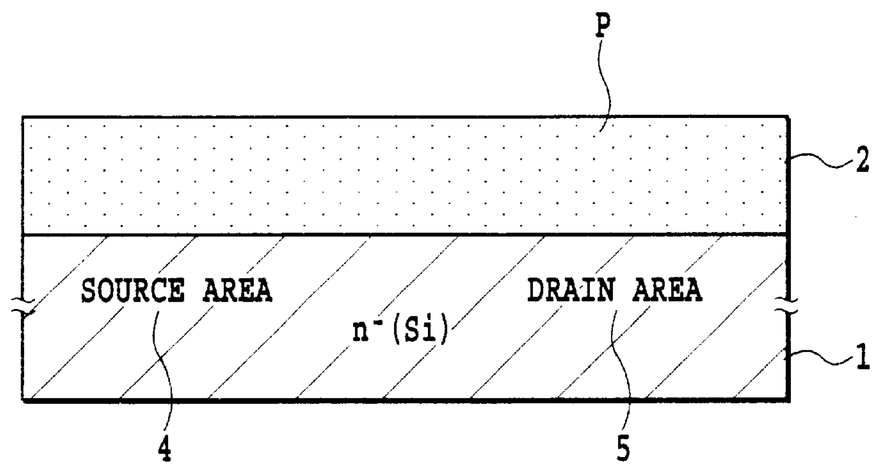

Then, in FIG. 1B, a diffusion source layer 2, having a diffusion source for diffusing into a source area 4 and a drain area 5, is formed on the silicon substrate 1 (n−). The forming process may be the well-known CVD (Chemical Vapor Deposition) process or the like.

In this case, a p type (for example, boron) is used as the diffusion source, that is, a type opposite to that of the silicon substrate 1. Boron density as the p type is 10 wt % (an upper limit value).

The diffusion source layer 2 is comprised of a silicon oxide film or a polysilicon film containing a p-type diffusion source such as boron. A thickness of the diffusion source layer 2 is between 10 nm and 2000 nm.

The n-type diffusion source may be comprised of elements such as phosphorous, arsenic, or antimony.

(Step 3)

Figure 1C:
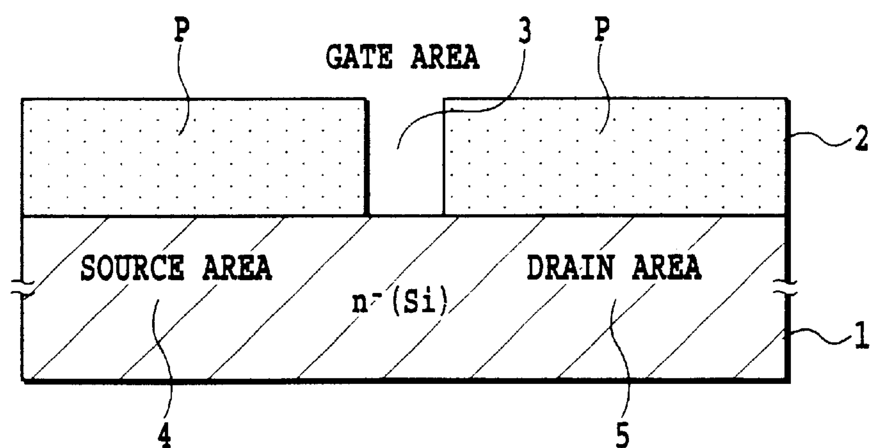

Then, in FIG. 1C, a part of the diffusion source layer 2 corresponding to the gate area 3 is etched down to the area of the silicon substrate 1, thus forming the gate area 3.

That is, the part of the diffusion source layer 2 (silicon oxide film or polysilicon film) corresponding to the gate area 3 is etched, by using an exposure technique, until a surface of the silicon substrate 1 is exposed, thereby forming the patterned gate area 3 having a predetermined width.

(Step 4)

Figure 2A:
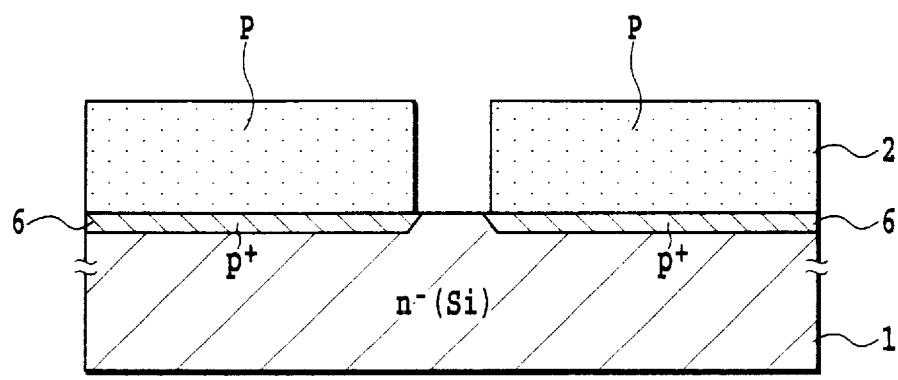
FIGS. 2A, 2B and 2C are process diagrams showing a manufacturing process corresponding to a continued part of FIGS. 1A, 1B and 1C.

Then, in FIG. 2A, thermal treatment is performed on the silicon substrate 1. In this case, in a self-aligning manner, the diffusion source is diffused into only areas corresponding to both the source area 4 and the drain area 5, thereby forming a diffusion layer 6 in each of the source area 4 and the drain area 5.

That is, by operating a thermal diffusion furnace under predetermined thermal treatment conditions, the diffusion source of the diffusion source layer is diffused on the source area 4 and the drain area 5 in a self-aligning manner, thereby forming the high-density (shown as $p^+$) diffusion layer 6.

Additionally, since the diffusion layer 6 has been formed in a self-aligning manner during the thermal diffusion process, the source area 4 and the drain area 5 are electrically separated from the gate area 3 due to a pn junction.

The impurity density of the p type is $10^{21}/cm^3$ at maximum. The thermal treatment conditions is that, for examples, an atmosphere of nitrogen or oxygen, a maximum temperature of 1,200° C., and a thermal treatment period of several hours.

(Step 5)

Figure 2B:
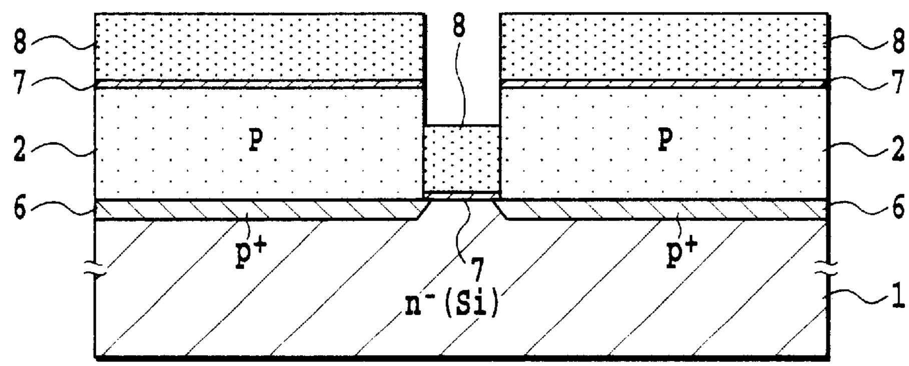

Then, in FIG. 2B, a gate insulating film 7 and a gate electrode 8 are formed on the thermally treated silicon substrate 1.

That is, the gate insulating film 7 is deposited all over the surface of the silicon substrate 1 by 1 nm to 100 nm, and further the gate electrode 1 is deposited thereon by 5 nm to 100 nm.

Thermally intolerant materials are used effectively as the gate insulating film 7 and the gate electrode 8.

The term "thermally intolerant materials" as used herein refers to not only materials that have physical phenomena, such as evaporation, decomposition, atomic species diffusion, or reaction during the thermal diffusion process and then lose their functions as the insulating film and electrode but also materials that are possible to affect even adjacent materials. For example, these thermally intolerant materials include all metals causing metal contamination against silicon and insulating film materials and reacting to silicon, their oxide materials, and organic compound materials having a low melting point, etc.

Additionally, the gate insulating film 7 may be comprised of a material having a higher dielectric constant than a silicon oxide film and the gate electrode 8 may be comprised of a metal having a lower resistivity than a polysilicon, improving effectively the high performance of the transistor.

Further, the gate insulating film 7 may be comprised of a magnetic or ferroelectric material.

Specific examples of the materials will be described below.

A high-dielectric-constant material is used as the gate insulating film 7 includes $Al_2O_3$, $La_2O_3$, $ZrO_2$, $HfO_2$, $LaAlO_3$, $Ta_2O_5$, $Y_2O_3$, $SrTiO_3$, MgO, $CaF_2$, or $BaF_2$, etc.

A ferroelectric material is used as the gate insulating film 7 includes $SrBi_2TaO_9$, $Bi_4Ti_3O_{12}$, $YMnO_3$, or $BaTiO_3$, etc.

A ferromagnetic material is used as the gate insulating film 7 includes (La, Sr) $MnO_3$, $BiFeO_3$, $BiMnO_3SrRuO_3$, or $Fe_3O_4$.

A metal is used as the gate electrode 8 includes Ti, Zr, Hf, V, Mo, Ta, W, Co, Ni, Pd, Pt, $TiSi_2$, $ZrSi_2$, $HfSi_2$, $VSi_2$, $MoSi_2$, $WSi_2$, $CoSi_2$, $NiSi_2$, $PdSi_2$, or $PtSi_2$, etc.

However, the materials are not limited to the above representative examples and a material that is comprised of various compositions are applicable.

(Step 6)

Figure 2C:
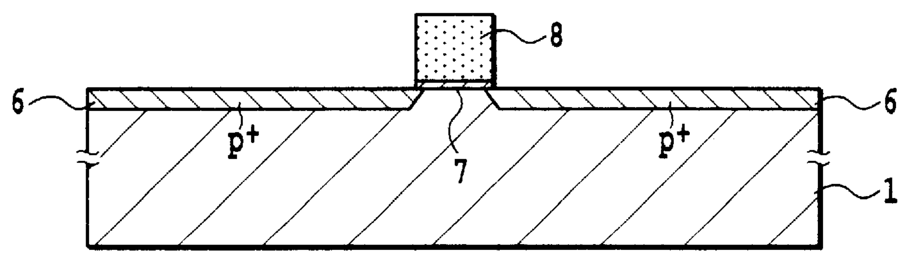

Finally, in FIG. 2C, by using an etching liquid, the diffusion layer as well as the gate insulating film 7 and the gate electrode 8 formed on the diffusion source layer 2 are removed, thereby forming a gate stacking structure having both the gate insulating film 7 and the gate electrode 8.

For example, the etching liquid is comprised of a hydrofluoric acid based solution if the diffusion source layer 2 is a silicon oxide film, or an alkaline solution if the diffusion source layer 2 is a polysilicon film. In either case, however, a solution that does not solve the gate insulating film 7 or the metal gate electrode 8 may be used.

Then, by using such an etching liquid and the lift-off method, releasing the diffusion source layer 2 as well as removing both the gate insulating film 7 and the gate electrode 8 corresponding to the source area 4 and the drain area 5 except the gate area 3 can be performed simultaneously.

This enables formation of the gate stacking structure having both the gate insulating film 7 and the gate electrode 8 formed only on the gate area 3, thereby producing a self-aligned transistor wherein the gate area 3 becomes self-aligned with the source area 4 and the drain area 5.

As described above, according to the present invention, by using the heat treatment, the diffusion source is diffused into both the source area and the drain area, in a self-aligning manner, and further, the gate insulating film and the metal gate electrode are formed on both the gate area and the diffusion source layer, and then the lift-off operation is performed, thus forming the gate stacking structure having both the gate insulating film and the gate electrode formed only according to the gate area.

Consequently, thermally intolerant materials may be used as both the gate insulating film and the gate electrode, thus improving electrical characteristics such as the transistor of high speed characteristic.

Additionally, according to the present invention, the conventional semiconductor process technique is directly applicable to such a transistor represented by the MIS FET, so that manufacturing costs can be reduced, thereby producing transistor devices of low-cost.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A process for manufacturing a self-aligned transistor comprising:

forming a diffusion source layer directly on a substrate so as to directly cover areas corresponding to a gate area, a source area, and a drain area, the diffusion source layer being comprised of a diffusion source for diffusion;

forming a pattern, corresponding to said gate area, on said diffusion source layer;

removing said diffusion source layer corresponding to said pattern down to said substrate to expose said gate area;

diffusing said diffusion source including said diffusion source layer into both said source area and said drain area except said gate area, by using heat treatment;

forming a gate insulting film over both said gate area and said thermally diffused diffusion source layer;

forming a gate electrode, comprised of metal, over said gate insulating film; and removing said diffusion source layer as well as said gate insulating film and said gate electrode formed on said diffusion source layer to form a gate stacking structure having both said gate insulating film and said gate electrode formed only according to said gate area.

2. A process for manufacturing a self-aligned transistor as claimed in claim 1, wherein said gate insulating film and said gate electrode are comprised of thermally intolerant materials.

3. A process for manufacturing a self-aligned transistor as claimed in claim 2, wherein said gate insulating film is comprised of a material having a higher dielectric constant than that of a silicon oxide film, and said gate electrode is comprised of a material having a lower resistivity than that of polysilicon.

4. A process for manufacturing a self-aligned transistor as claimed in claim 2, wherein said gate insulating film is comprised of a magnetic or a ferroelectric material.

5. A process for manufacturing a self-aligned transistor as claimed in claim 1, wherein said gate insulating film is comprised of a material having a higher dielectric constant than that of a silicon oxide film, and said gate electrode is comprised of a material having a lower resistivity than that of polysilicon.

6. A process for manufacturing a self-aligned transistor as claimed in claim 1, wherein said gate insulating film is comprised of a magnetic or a ferroelectric material.

7. A process for manufacturing a self-aligned transistor, the process comprising:

forming a diffusion source layer directly on a semiconductor substrate so as to directly cover areas corresponding to a gate area, a source area, and a drain area, the diffusion source layer being comprised of a diffusion source;

removing a portion of said diffusion source layer so as to openly expose said gate area directly above said substrate;

thermally diffusing said diffusion source into both said source area and said drain area;

forming a gate insulting film over both said gate area and said thermally diffused diffusion source layer;

forming a gate electrode, comprised of metal, over said gate insulating film;

removing said diffusion source layer as well as said gate insulating film and said gate electrode formed on said diffusion source layer to form a gate stacking structure having both said gate insulating film and said gate electrode formed on said gate area.

8. The process of claim 7, wherein said gate insulating film comprises a thermally intolerant material.

9. The process of claim 7, wherein said gate electrode comprises a thermally intolerant material.

10. The process of claim 7, wherein said gate insulating film comprises a material having a higher dielectric constant than that of a silicon oxide film.

11. The process of claim 7, wherein said gate electrode comprises a material having a lower resistivity than that of polysilicon.

12. The process of claim 7, wherein said gate insulating film comprises at least one of $Al_2O_3$, $La_2O_3$, $ZrO_2$, $HfO_2$, $LaAlO_3$, $TaO_5$, $Y_2O_3$, $SrTiO_3$, MgO, $CaF_2$,and $BaF_2$.

13. The process of claim 7, wherein said gate insulating film comprises at least one of $MnO_3$, $BiFeO_3$, $BiMnO_3$, $SrRuO_3$, and $Fe_3O_4$.

14. The process of claim 7, wherein said gate electrode comprises at least one of Ti, Zr, Hf, V, Mo, Ta, W, Co, Ni, Pd, Pt, $TiSi_2$, $ZrSi_2$, $HfSi_2$, $VSi_2$, $MoSi_2$, $WSi_2$, $CoSi_2$, $NiSi_2$, $PdSi_2$, and $PtSi_2$.

15. A process for manufacturing a self-aligned transistor comprising:

forming a diffusion source layer including a diffusion source for diffusion on areas corresponding to a gate area, a source area, and a drain area;

forming a pattern, corresponding to said gate area, on said diffusion source layer;

removing said diffusion source layer corresponding to said pattern to form said gate area;

diffusing said diffusion source including said diffusion source layer into both said source area and said drain area except said gate area, by using heat treatment;

forming a gate insulting film comprised of a thermally intolerant material over both said gate area and said thermally diffused diffusion source layer;

forming a gate electrode, comprised of metal, over said gate insulating film;

removing said diffusion source layer as well as said gate insulating film and said gate electrode formed on said diffusion source layer to form a gate stacking structure having both said gate insulating film and said gate electrode formed only according to said gate area, said removing process being performed only once in a self-aligned manner based on a lift-off method by using a solution that does not dissolve said gate insulating film and said gate electrode.

16. The process according to claim 15, wherein a material on condition of containing at least a diffusion source is used as said material of said diffusion source layer.

* * * * *

UNITED STATES PATENT AND TRADEMARK OFFICE

CERTIFICATE OF CORRECTION

PATENT NO. : 6,365,470 B1
DATED : April 2, 2002
INVENTOR(S) : Tatsuro Maeda

It is certified that error appears in the above-identified patent and that said Letters Patent is hereby corrected as shown below:

Column 2,
Line 1, after "layer" change "correspondence" to -- corresponding --

Column 3,
Line 27, before "an atmosphere" change "examples," to -- example, --
Line 36, after "electrode" change "1" to -- 8 --

Column 5,
Line 4, before "film" change "insulting" to -- insulating --

Signed and Sealed this

Fourth Day of March, 2003

JAMES E. ROGAN
*Director of the United States Patent and Trademark Office*